(12) United States Patent
Kato

(10) Patent No.: US 9,586,303 B2
(45) Date of Patent: Mar. 7, 2017

(54) POLISHING DEVICE AND METHOD FOR POLISHING SEMICONDUCTOR WAFER

(71) Applicant: Kabushiki Kaisha Toshiba, Minato-ku (JP)

(72) Inventor: Shiguma Kato, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 104 days.

(21) Appl. No.: 14/633,907

(22) Filed: Feb. 27, 2015

(65) Prior Publication Data
US 2016/0074986 A1 Mar. 17, 2016

(30) Foreign Application Priority Data
Sep. 12, 2014 (JP) ................ 2014-185990

(51) Int. Cl.
| | |
|---|---|
| *B24B 49/04* | (2006.01) |
| *B24B 37/005* | (2012.01) |
| *B24B 37/04* | (2012.01) |
| *B24B 21/06* | (2006.01) |
| *B24B 21/18* | (2006.01) |
| *H01L 21/321* | (2006.01) |

(52) U.S. Cl.
CPC ............ *B24B 21/18* (2013.01); *B24B 21/06* (2013.01); *B24B 37/005* (2013.01); *B24B 37/04* (2013.01); *B24B 49/04* (2013.01); *H01L 21/321* (2013.01)

(58) Field of Classification Search
CPC ....... B24B 49/02; B24B 49/04; B24B 37/005; B24B 37/013; B24B 37/042; B24B 37/10; B24B 21/04; B24B 21/06; B24B 21/08

USPC .......... 451/9, 10, 11, 41, 303, 307
See application file for complete search history.

(56) References Cited

U.S. PATENT DOCUMENTS

| | | | | |
|---|---|---|---|---|
| 6,071,184 | A * | 6/2000 | Anderson, III | ....... B24B 41/061 451/364 |
| 6,099,387 | A * | 8/2000 | Gilmer | ............... B24B 9/065 451/10 |
| 6,116,988 | A * | 9/2000 | Ball | .................. B24B 37/04 451/41 |
| 6,458,019 | B1 * | 10/2002 | Gonda | ................ B24B 1/00 451/41 |

(Continued)

FOREIGN PATENT DOCUMENTS

| | | |
|---|---|---|
| JP | 3949941 | 7/2007 |
| JP | 4090247 | 5/2008 |

(Continued)

*Primary Examiner* — Eileen Morgan
(74) *Attorney, Agent, or Firm* — Oblon, McClelland, Maier & Neustadt, L.L.P.

(57) ABSTRACT

According to one embodiment, a polishing device includes a stage, a polishing unit, a warp suppressing unit, and an adsorbing mechanism. A semiconductor wafer is mounted onto the stage. The stage is rotatable around a first shaft. The polishing unit applies a force to and polishes a rear surface of the semiconductor wafer mounted on the stage. The warp suppressing unit applies a force to, during the polishing, an outer circumferential part of a front surface of the semiconductor wafer. The adsorbing mechanism adsorbs, during the polishing, a first region in the rear surface of the semiconductor wafer. The first region is on a center side relative to an area at which the polishing is performed.

18 Claims, 3 Drawing Sheets

(56) References Cited

U.S. PATENT DOCUMENTS

| | | | |
|---|---|---|---|
| 6,558,239 B2* | 5/2003 | Kunisawa | B24B 9/065 451/303 |
| 6,652,356 B1* | 11/2003 | Ariga | B28D 5/0064 125/16.02 |
| 6,933,234 B2 | 8/2005 | Nakamura et al. | |
| 7,351,131 B2 | 4/2008 | Nakamura et al. | |
| 7,367,873 B2* | 5/2008 | Ishii | B24B 9/065 451/168 |
| 8,210,905 B2* | 7/2012 | Sakairi | B24B 9/065 451/168 |
| 2008/0188167 A1 | 8/2008 | Ishii et al. | |
| 2012/0252320 A1* | 10/2012 | Seki | B24B 21/002 451/28 |
| 2014/0087627 A1* | 3/2014 | Togawa | B24B 9/065 451/1 |
| 2014/0094095 A1 | 4/2014 | Togawa et al. | |
| 2015/0104620 A1* | 4/2015 | Takahashi | B24B 9/065 428/192 |

FOREIGN PATENT DOCUMENTS

| | | |
|---|---|---|
| JP | 4156200 | 9/2008 |
| JP | 2014 61580 | 4/2014 |
| JP | 2014 63955 | 4/2014 |

\* cited by examiner

POLISHING DEVICE AND METHOD FOR POLISHING SEMICONDUCTOR WAFER

CROSS-REFERENCE TO RELATED APPLICATIONS

This application is based upon and claims the benefit of priority from Japanese Patent Application No. 2014-185990, filed on Sep. 12, 2014; the entire contents of which are incorporated herein by reference.

FIELD

Embodiments described herein relate generally to a polishing device and a method for polishing a semiconductor wafer.

BACKGROUND

In a process for manufacturing a semiconductor device, a polishing for a rear surface of a semiconductor wafer is performed to remove an unnecessary film (burr) formed at an outer circumferential part of the rear surface of a semiconductor wafer. The rear surface polishing of the semiconductor wafer is performed by bringing a polishing unit into contact with the burrs, and applying a force to the rear surface. Thus, during the polishing of the rear surface, the semiconductor wafer receives pressure from the polishing unit, and the semiconductor wafer is warped. This warping of the semiconductor wafer reduces the polishing rate.

In order to suppress such warping of the semiconductor wafer, an adsorption force of a vacuum chuck that holds the semiconductor wafer from the front surface of the semiconductor wafer can be increased, but in this case, the front surface of the semiconductor wafer may be damaged due to the increase in the adsorption force. A method for holding the semiconductor wafer only at the outer circumferential part of the semiconductor wafer is considered to avoid such damage, but this method cannot sufficiently suppress the warping of the semiconductor wafer described above caused by the rear surface polishing of the semiconductor wafer.

DETAILED DESCRIPTION

In general, according to one embodiment, a polishing device includes a stage, a polishing unit, a warp suppressing unit, and an adsorbing mechanism. A semiconductor wafer is mounted onto the stage. The stage is rotatable around a first shaft. The polishing unit applies a force to and polishes a rear surface of the semiconductor wafer mounted on the stage. The warp suppressing unit applies a force to, during the polishing, an outer circumferential part of a front surface of the semiconductor wafer mounted on the stage. The adsorbing mechanism adsorbs, during the polishing, a first region in the rear surface of the semiconductor wafer. The first region is on a center side relative to an area at which the polishing is performed.

Exemplary embodiments of a polishing device and a method for polishing a semiconductor wafer will be explained below in detail with reference to the accompanying drawings. The present invention is not limited to the following embodiments.

(First Embodiment)

Figure 1:
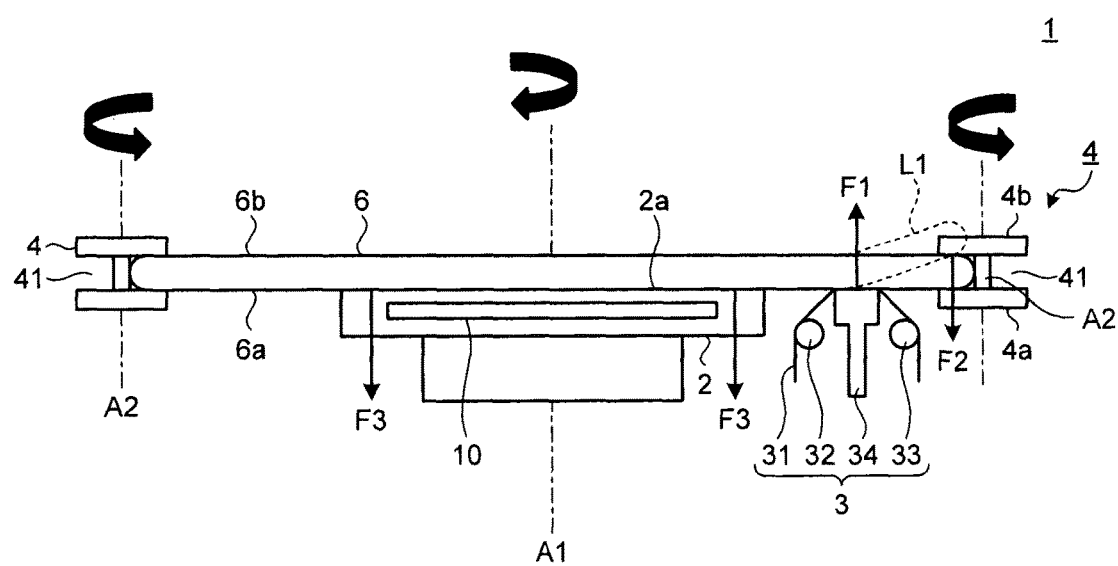
FIG. 1 is a view illustrating a configuration of a polishing device according to a first embodiment.

FIG. 1 is a view illustrating a configuration of a polishing device 1 according to a first embodiment. As illustrated, the polishing device 1 includes a stage 2, a polishing unit 3, and a warp suppressing unit 4. The stage 2 can hold a semiconductor wafer 6 mounted on an upper surface 2a of the stage 2 by vacuum adsorption of, for example, a vacuum adsorbing mechanism 10. The vacuum adsorbing mechanism 10 acts a force F3 on the semiconductor wafer 6 to adsorb the semiconductor wafer 6 to the stage 2. In the illustrated example, the force F3 acts from the top to the bottom (direction from a front surface 6b positioned on a side opposite to a rear surface 6a of the semiconductor wafer 6 to the rear surface 6a) with respect to the rear surface 6a of the semiconductor wafer 6 mounted on the stage 2. When a rotation force is applied from a rotation mechanism such as a motor, and the like (not illustrated), the stage 2 rotates about a shaft A1 at high speed, thus rotating the semiconductor wafer 6 mounted on the upper surface 2a at high speed. The shaft A1 is substantially perpendicular to the upper surface 2a. The rear surface 6a of the semiconductor wafer 6 is mounted on the upper surface 2a of the stage 2. A chip region including an circuit element and a wiring is formed in the front surface 6b of the semiconductor wafer 6. Layers of reaction products (deposited films) are formed on the front surface 6b of the semiconductor wafer 6, while the burrs are formed on the outer circumferential part (outer edge part) of the rear surface 6a of the semiconductor wafer 6. Bumps are formed at the outer circumferential part (outer edge part) of the rear surface 6a of the semiconductor wafer 6 by the burrs (not illustrated), and then are wrapped around the side surface of the semiconductor wafer 6 to the rear surface 6a of the semiconductor wafer 6.

The polishing unit 3 is arranged at the outer side of the stage 2. The polishing unit 3 is arranged to oppose to the outer circumferential part of the rear surface 6a of the semiconductor wafer 6 mounted on the upper surface 2a of the stage 2. The polishing unit 3 includes a polishing tape 31, guide rollers 32, 33, and a head 34. The polishing tape 31 is supplied from a supply reel (not illustrated) to between the head 34 and the rear surface 6a of the semiconductor wafer 6. The polishing tape 31 is wound around the guide rollers 32, 33, and a predetermined force (pressure) F1 is applied from the head 34 at between the guide rollers 32, 33. The polishing tape 31 is in contact with the outer circumferential part of the rear surface 6a of the semiconductor wafer 6 and applies the force to the outer circumferential part of the rear surface 6a from the bottom to the top (direction from the rear surface 6a to the front surface 6b) with the force F1. Abrasive grains such as diamonds are fixed to a contacting surface of the polishing tape 31. The outer circumferential part of the rear surface 6a is polished by the friction generated between the polishing tape 31 and the rear surface 6a of the high-speed rotating semiconductor wafer 6, thus removing the burrs. The polishing tape 31 is travelled at a predetermined speed from the supply reel (not illustrated) toward a collecting reel, and the contacting surface abraded by the polishing of the rear surface 6a is collected by the collecting reel. The head 34 is movable in a radial direction of the semiconductor wafer 6, so that the polishing position on the rear surface 6a of the semiconductor wafer 6 can be adjusted. The polishing device 1 includes a plurality of polishing units 3, which plurality of polishing units 3 may be arranged dispersedly at the rear surface 6*a* side of the semiconductor wafer 6. Thus, the polishing time of the rear surface 6*a* can be reduced.

The warp suppressing unit 4 is arranged at the outer circumferential part of the semiconductor wafer 6 by a not illustrated mechanism. The warp suppressing unit 4 has a function of applying a force to a non-chip region (outer side of the chip region) of the front surface 6*b* of the semiconductor wafer 6 from the top to the bottom (direction from the front surface 6*b* to the rear surface 6*a*) with a force F2. That is, the warp suppressing unit 4 has a function of applying the force to the outer circumferential part of the front surface 6*b* of the semiconductor wafer 6. In other words, the warp suppressing unit 4 regulates the movement from the lower side to the upper side of the outer circumferential part of the semiconductor wafer 6. Consider a case in which the front surface 6*b* is not pushed by the warp suppressing unit 4 while the rear surface 6*a* of the semiconductor wafer 6 is polished, as a comparative example. In the case of the comparative example, the semiconductor wafer 6 is warped from the rear surface 6*a* side toward the front surface 6*b* side, as illustrated with a dotted line L1 in FIG. 1, by the force F1 applied on the rear surface 6*a* from the polishing unit 3. On the contrary, the warp suppressing unit 4 exhibits the function of applying the force to the outer circumferential part of the front surface 6*b* of the semiconductor wafer 6 and can suppress the warping of the semiconductor wafer 6 with the force F2 opposing the force F1. In the illustrated example, the polishing device 1 includes two warp suppressing units 4 arranged in a dispersed manner, but the number of warp suppressing units 4 is not limited to two. The polishing device 1 may include one or three or more warp suppressing units 4, where the effect of suppressing the warping of the semiconductor wafer 6 can be enhanced the greater the number of warp suppressing units 4.

The warp suppressing unit 4 illustrated in FIG. 1 is supported to be freely rotatable around a shaft A2 substantially parallel to the shaft A1. The warp suppressing unit 4 is formed with a groove 41 that goes around the shaft A2 once to become continuous. The warp suppressing unit 4 has a substantially H-shape in cross section. In other words, the warp suppressing unit 4 includes an upper plate 4*b* that is in contact with the outer circumferential part of the front surface 6*b* of the semiconductor wafer 6, a lower plate 4*a* that is in contact with the outer circumferential part of the rear surface 6*a* of the semiconductor wafer 6, and the shaft A2 that rotatably supports the upper plate 4*b* and the lower plate 4*a*. The outer circumferential part of the semiconductor wafer 6 is interposed in the groove 41 formed between the upper plate 4*b* and the lower plate 4*a*. The groove 41 has a dimension at which that the outer circumferential part of the semiconductor wafer 6 can be interposed, and that can maintain the high-speed rotation on the stage 2 of the semiconductor wafer 6 interposed to the groove 41. The warp suppressing unit 4 of FIG. 1 suppresses the warping of the semiconductor wafer 6 by interposing the outer circumferential part of the semiconductor wafer 6 to the groove 41 to sandwich the outer circumferential part of the semiconductor wafer 6, and applying the force to the outer circumferential part of the front surface 6*b* of the semiconductor wafer 6 with the force F2. The illustrated warp suppressing unit 4 receives a frictional force from the rotating semiconductor wafer 6 while applying the force to the front surface 6*b* of the semiconductor wafer 6, and rotates around the shaft A2 with the frictional force. The rotation of the warp suppressing unit 4 accompanied with the rotation of the semiconductor wafer 6 suppresses damages (e.g., the front surface 6*b* of the semiconductor wafer 6 and the warp suppressing unit 4 being scraped and scratched by the friction of each other) caused by the rotation friction between the semiconductor wafer 6 and the warp suppressing unit 4.

A region of the center (inner) side relative to the polishing area (contacting portion of the rear surface 6*a* and the polishing tape 31) in the rear surface 6*a* of the semiconductor wafer 6 is adsorbed with the force F3 by the stage 2. Thus, the warping of the semiconductor wafer 6 is suppressed even on the region of the center side, and the warping of the semiconductor wafer 6 is suppressed as a whole. In the present embodiment, the rear surface 6*a* of the semiconductor wafer 6 is adsorbed by the stage 2 holding the semiconductor wafer 6, and the force F3 in the direction from the front surface 6*b* to the rear surface 6*a* of the semiconductor wafer 6 is acted, but the force F3 is not limited to the action based on the stage 2. The adsorbing mechanism 10 is not limited to the embodiment, as long as the mechanism adsorbs, with the force F3, the region of the center side (the inner side) relative to the polishing area during the polishing of the rear surface 6*a* of the semiconductor wafer 6.

Next, a method for polishing the semiconductor wafer 6 by the polishing device 1 will be described. First, the rear surface 6*a* of the semiconductor wafer 6 to be polished is mounted on the upper surface 2*a* of the stage 2. the adsorbing mechanism 10 adsorbs the region of the center (inner) side relative to the polishing area in the rear surface 6*a* of the semiconductor wafer 6 with the force F3. The semiconductor wafer 6 is held on the stage 2. Then, the semiconductor wafer 6 is rotated at high speed around the shaft A1 by the rotation of the stage 2. The warp suppressing unit 4 is arranged at the outer circumferential part of the semiconductor wafer 6 to apply the force to the non-chip region at the outer circumferential part of the front surface 6*b* of the semiconductor wafer 6 with the force F2. The polishing tape 31 is brought into contact with the outer circumferential part of the rear surface 6*a* to apply the force to the outer circumferential part of the rear surface 6*a* with the force F1. Thus, the frictional force is generated between the rear surface 6*a* and the polishing tape 31, and the rear surface 6*a* can be polished. During the polishing of the rear surface 6*a*, the forces F2, F3 are continuously acted on the semiconductor wafer 6 to suppress the warping of the semiconductor wafer 6.

Figure 2A:
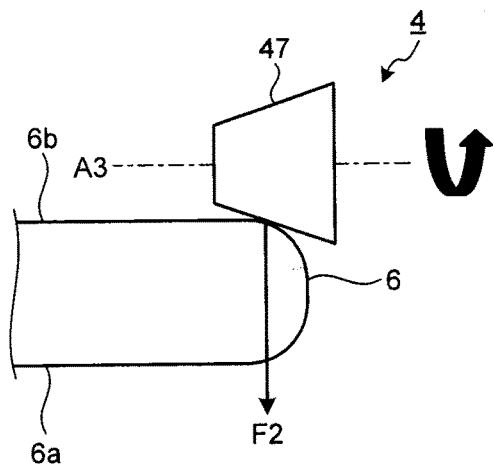
FIGS. 2A, 2B, and 2C are views each illustrating variants of a warp suppressing unit illustrated in FIG. 1.
Figure 2B:
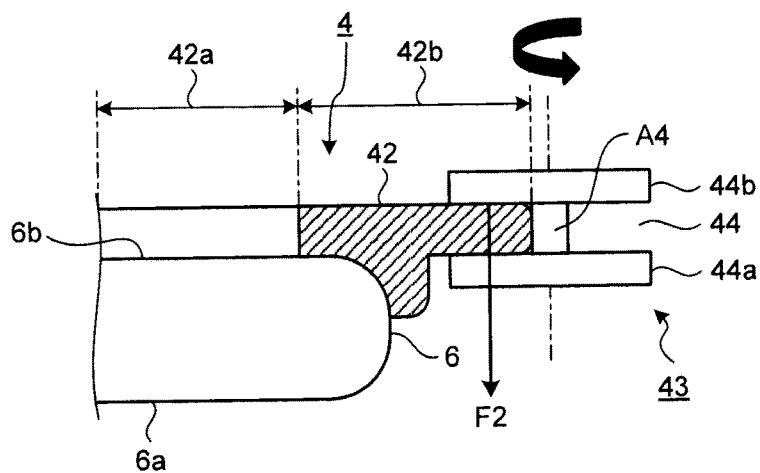
Figure 2C:
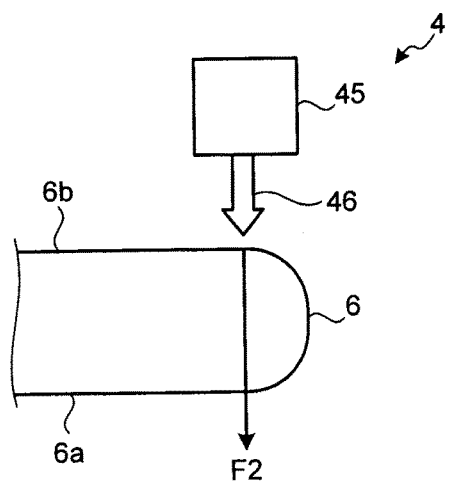

FIGS. 2A, 2B, and 2C illustrate variants of the warp suppressing unit 4 illustrated in FIG. 1. The warp suppressing unit 4 is not limited to any embodiments, as long as the unit has the function of applying a force to the outer circumferential part of the front surface 6*b* of the semiconductor wafer 6, and various modes may be adopted. The warp suppressing unit 4 may, for example, adopt the modes illustrated in FIGS. 2A to 2C.

The warp suppressing unit 4 illustrated in FIG. 2A includes a member 47 that is in contact with the outer circumferential part of the front surface of the semiconductor wafer 6, and a shaft A3 that rotatably supports the member 47. The member 47 has a circular cone shape or a circular truncated cone shape in which the radius becomes greater away from the center of the semiconductor wafer 6. The member 47 is arranged on the front surface 6*b* of the semiconductor wafer 6, and generates a force F2 by making contact with the outer circumferential part of the front surface 6*b* of the semiconductor wafer 6 to apply the force to the front surface 6*b*. The member 47 is supported to be freely rotatable around the shaft A3 substantially parallel (substantially perpendicular to the shaft A1 illustrated in FIG. 1) to the front surface 6b of the semiconductor wafer 6. The shaft A3 is desirably arranged along the radial direction of the semiconductor wafer 6. The member 47 receives the frictional force from the rotating semiconductor wafer 6 while making contact with the front surface 6b of the semiconductor wafer 6, and rotates around the shaft A3 by the frictional force. Such rotation suppresses the damages by the rotation friction between the semiconductor wafer 6 and the warp suppressing unit 4.

The warp suppressing unit 4 illustrated in FIG. 2B includes an indirect member 42 and a holding member 43. FIG. 2B illustrates a part of the indirect member 42 in cross-section. The indirect member 42 includes a fixing portion 42a and a flange portion 42b. The fixing portion 42a is a portion to be fixed to the front surface 6b of the semiconductor wafer 6. The flange portion 42b is a portion projected, in a flange form, at outer side from the outer circumferential part of the semiconductor wafer 6, and is arranged over the entire circumference of the outer circumferential part of the semiconductor wafer 6. The indirect member 42 is high speed rotated integrally with the semiconductor wafer 6 since the fixing portion 42a is fixed to the front surface 6b of the semiconductor wafer 6. The holding member 43 includes an upper plate 44b that is in contact with the front surface of the flange portion 42b, a lower plate 44a that is in contact with the rear surface of the flange portion 42b, and a shaft A4 that rotatably supports the upper plate 44b and the lower plate 44a. An outer circumferential part of the flange portion 42b is interposed in a groove 44 formed between the upper plate 44b and the lower plate 44a. The shaft A4 is substantially perpendicular to the front surface 6b of the semiconductor wafer 6 (substantially parallel to the shaft A1 illustrated in FIG. 1). The groove 44 goes around the shaft A4 once to become continuous. The holding member 43 thus has a substantially H shape in cross-section. The holding member 43 has a dimension at which the flange portion 42b of the indirect member 42 can be interposed to the groove 44, and that can maintain the high speed rotation of the semiconductor wafer 6 in a manner integrated with the indirect member 42 even in a state the flange portion 42b is interposed to the groove 44.

In FIG. 2B, the flange portion 42b of the indirect member 42 fixed to the front surface 6b of the semiconductor wafer 6 is interposed to the groove 44 of the holding member 43. Then the outer circumferential part of the semiconductor wafer 6 is held. The holding member 43 apply a force to the outer circumferential part of the front surface 6b of the semiconductor wafer 6 with the force F2, so that the warping of the semiconductor wafer 6 can be suppressed. The rotation friction between the rotating semiconductor wafer 6 and the holding member 43 is suppressed by interposing the indirect member 42 between the semiconductor wafer 6 and the holding member 43, and the damages (e.g., front surface 6b of the semiconductor wafer 6 being scraped and scratched by friction) on the semiconductor wafer 6 by the rotation friction is suppressed. The holding member 43 receives the frictional force from the indirect member 42 rotating with the semiconductor wafer 6 while applying the force to the front surface 6b of the semiconductor wafer 6 through the indirect member 42, and rotates around the shaft A4 by the frictional force. Such rotation suppresses the damages (e.g., the indirect member 42 and the holding member 43 being scraped by friction) by the rotation friction between the indirect member 42 and the holding member 43.

The warp suppressing unit 4 illustrated in FIG. 2C includes a nozzle 45. The nozzle 45 is disposed above the front surface 6b of the semiconductor wafer 6, and discharges a high pressure fluid 46 toward the outer circumferential part of the front surface 6b. The fluid 46 is liquid such as water or gas such as air. Thus, the warp suppressing unit 4 can discharge the fluid 46 to the outer circumferential part of the front surface 6b of the semiconductor wafer 6 to generate a force F2 as the pressure of the fluid 46 and apply the force to the front surface 6b of the semiconductor wafer 6. When the semiconductor wafer 6 is applied the force by the liquid or the gas, the contact with a solid is resolved and the damages are suppressed.

According to the first embodiment, the warp suppressing unit 4 applies the force to the outer circumferential part of the front surface 6b of the semiconductor wafer 6 mounted on the stage 2 with the force F2 opposing the force F1 applied from the polishing unit 3 during the polishing of the rear surface 6a of the semiconductor wafer 6. Therefore, the polishing device 1 can suppress the warping of the semiconductor wafer 6 and polish the rear surface 6a. As the warping of the semiconductor wafer 6 is suppressed, the polishing device 1 can polish the rear surface 6a with a strong force F1 and the polishing rate of the burrs, and the like can be enhanced.

(Second Embodiment)

Figure 3:
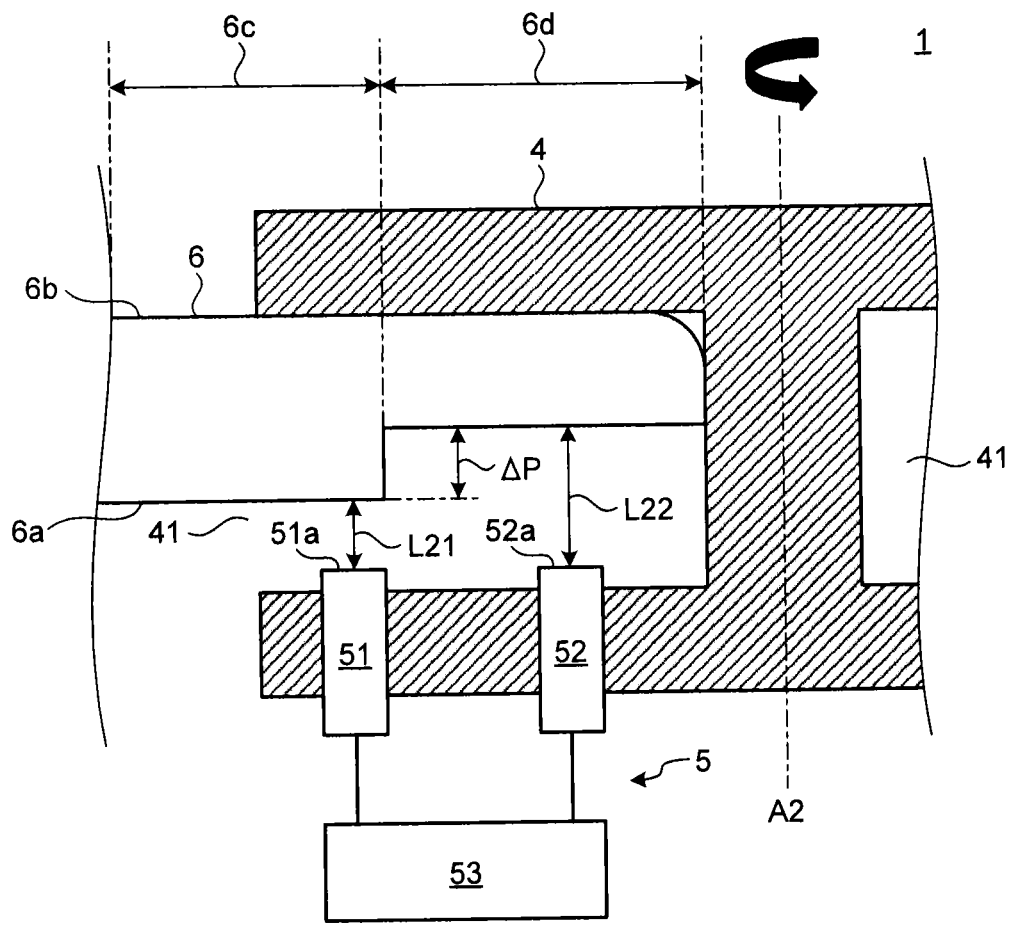
FIG. 3 is a view illustrating a configuration of a measuring unit of a polishing device according to a second embodiment.

FIG. 3 is a view illustrating a configuration of a measuring unit 5 of the polishing device 1 according to the second embodiment. The polishing device 1 according to the second embodiment includes all the configurations of the polishing device 1 according to the first embodiment, and has characteristics in that a polished amount ΔP is measured. The same reference numerals are denoted on the configurations similar to the first embodiment, and the redundant description will be omitted. FIG. 3 illustrates the warp suppressing unit 4 in cross-section.

As illustrated in FIG. 3, the polishing device 1 according to the second embodiment includes the measuring unit 5. The measuring unit 5 includes displacement gauges 51, 52, and a calculating unit 53. The displacement gauges 51, 52 are attached to the warp suppressing unit 4 so that the heights of the distal end faces 51a, 52a match, and rotate with the warp suppressing unit 4. The displacement gauges 51, 52 move to positions facing the rear surface 6a of the semiconductor wafer 6 by such rotation, and measure distances L21, L22 between the rear surface 6a of the semiconductor wafer 6 and the distal end faces 51a, 52a, respectively. The displacement gauges 51, 52 may be an optical type or a differential transformer type, for example. The displacement gauges 51, 52 do not necessarily need to be attached to the warp suppressing unit 4, and may be fixedly attached to positions facing the rear surface 6a of the semiconductor wafer 6.

The displacement gauge 51 is arranged at a position facing the non-polishing surface 6c (surface not polished by the polishing unit 3 illustrated in FIG. 1 of the rear surface 6a) when moved to the position facing the rear surface 6a of the semiconductor wafer 6, and measures the distance L21 from the non-polishing surface 6c to the distal end face 51a and transmits the measurement result to the calculating unit 53. During the polishing of the rear surface 6a of the semiconductor wafer 6, the distance L21 basically does not fluctuate, and thus the distance L21 can be adopted as a reference distance from the rear surface 6a in the measurement of the polished amount ΔP.

The displacement gauge 52 is arranged at a position facing the polishing surface 6d (surface polished by the polishing unit 3 illustrated in FIG. 1 of the rear surface 6a) when moved to the position facing the rear surface 6a of the semiconductor wafer 6, and measures the distance L22 from the polishing surface 6d to the distal end face 52a and transmits the measurement result to the calculating unit 53. The distance L22 fluctuates according to the polished amount ΔP of the rear surface 6a of the semiconductor wafer 6, and becomes larger the greater the polished amount ΔP.

When receiving the measurement results related to the distances L21, L22 from the measuring unit 5, the calculating unit 53 calculates the polished amount ΔP of the polishing surface 6d with respect to the non-polishing surface 6c with the following equation (1).

$$\Delta P = L22 - L21 \qquad \text{equation (1)}$$

The calculating unit 53 displays the calculated polished amount ΔP on a display unit (not illustrated), for example. The polished amount ΔP does not necessarily need to be calculated by the calculating unit 53. For example, the displacement gauges 51, 52 may display the distances L21, L22 measured by the displacement gauges 51, 52, and the user of the polishing device 1 may calculate the polished amount ΔP according to the equation (1) based on the displayed distances L21, L22.

According to the second embodiment, the measuring unit 5 calculates the polished amount ΔP of the rear surface 6a of the semiconductor wafer 6. Therefore, the monitoring of the polished amount ΔP and the control of the polished amount ΔP are facilitated. The control of the polished amount ΔP includes, for example, adjusting the force F1 according to the time change of the polished amount ΔP and terminating the polishing of the semiconductor wafer 6 at a predetermined polished amount ΔP (end point).

According to the second embodiment, the measuring unit 5 measures the distances L21, L22 with the two displacement gauges 51, 52, and measures the polished amount ΔP with respect to the non-polishing surface 6c. Therefore, the polishing device 1 can measure the polished amount ΔP with respect to the non-polishing surface 6c eliminating the influence of the spacing (corresponds to the distance L21) between the rear surface 6a before the polishing of the semiconductor wafer 6 and the distal end faces 51a, 52a of the displacement gauges 51, 52.

While certain embodiments have been described herein, these embodiments have been presented by way of example only, and are not intended to limit the scope of the present invention. Indeed, the novel embodiments described herein may be embodied in a variety of other embodiments; furthermore, various omissions, substitutions and changes in the form of the embodiments described herein may be made without departing from the spirit of the invention. The accompanying claims and their equivalents are intended to cover such embodiments or modifications as would fall within the scope and spirit of the invention.

What is claimed is:

1. A polishing device comprising:
a stage onto which a semiconductor wafer is mounted, the stage being rotatable around a first shaft;
a polishing unit that applies a force to and polishes a rear surface of the semiconductor wafer mounted on the stage;
a warp suppressing unit that applies a force to, during the polishing, an outer circumferential part of a front surface of the semiconductor wafer mounted on the stage by making contact with the outer circumferential part of the front surface of the semiconductor wafer, the warp suppressing unit rotating with a rotation of the semiconductor wafer; and
an adsorbing mechanism that adsorbs, during the polishing, a first region in the rear surface of the semiconductor wafer, the first region being on a center side relative to an area at which the polishing is performed,
wherein the warp suppressing unit includes,
a first member that is in contact with the outer circumferential part of the front surface of the semiconductor wafer, and
a second shaft arranged substantially perpendicular to the first shaft, and rotatably supports the first member, the second shaft being arranged along a radial direction of the semiconductor wafer, and
wherein the first member rotates around the second shaft by friction with the semiconductor wafer.

2. The polishing device according to claim 1, wherein the warp suppressing unit includes a plurality of warp suppressing devices arranged dispersedly at an outer circumferential part of the semiconductor wafer.

3. The polishing device according to claim 1, wherein the first member has a circular cone shape or a circular truncated cone shape in which a radius becomes greater away from a center of the semiconductor wafer.

4. The polishing device according to claim 1, wherein the polishing unit is movable in a radial direction of the semiconductor wafer.

5. The polishing device according to claim 1, wherein the polishing unit includes a plurality of polishing devices arranged dispersedly at the rear surface side of the semiconductor wafer.

6. A polishing device comprising:
a stage onto which a semiconductor wafer is mounted, the stage being rotatable around a first shaft;
a polishing unit that applies a force to and polishes a rear surface of the semiconductor wafer mounted on the stage;
a warp suppressing unit that applies a force to, during the polishing, an outer circumferential part of a front surface of the semiconductor wafer mounted on the stage, the warp suppressing unit including a nozzle that discharges fluid toward the outer circumferential part of the front surface of the semiconductor wafer; and
an adsorbing mechanism that adsorbs, during the polishing, a first region in the rear surface of the semiconductor wafer, the first region being on a center side relative to an area at which the polishing is performed.

7. The polishing device according to claim 6, wherein the warp suppressing unit includes a plurality of warp suppressing devices arranged dispersedly at an outer circumferential part of the semiconductor wafer.

8. The polishing device according to claim 6, wherein the polishing unit is movable in a radial direction of the semiconductor wafer.

9. The polishing device according to claim 6, wherein the polishing unit includes a plurality of polishing devices arranged dispersedly at the rear surface side of the semiconductor wafer.

10. A polishing device comprising:
a stage onto which a semiconductor wafer is mounted, the stage being rotatable around a first shaft;
a polishing unit that applies a force to and polishes a rear surface of the semiconductor wafer mounted on the stage;

a warp suppressing unit that applies a force to, during the polishing, an outer circumferential part of a front surface of the semiconductor wafer mounted on the stage;

an adsorbing mechanism that adsorbs, during the polishing, a first region in the rear surface of the semiconductor wafer, the first region being on a center side relative to an area at which the polishing is performed; and a measuring device that measures a polished amount of the semiconductor wafer, wherein the measuring device includes a first measuring unit that measures a first distance to a non-polishing surface of the rear surface of the semiconductor wafer, a second measuring unit that measures a second distance to a polishing surface of the rear surface of the semiconductor wafer, and a calculating unit configured to calculate the polished amount of the semiconductor wafer based on the first distance and the second distance.

11. The polishing device according to claim 10, wherein the warp suppressing unit applies the force to the front surface of the semiconductor wafer by making contact with the outer circumferential part of the front surface of the semiconductor wafer mounted on the stage.

12. The polishing device according to claim 10, wherein the warp suppressing unit includes a plurality of warp suppressing devices arranged dispersedly at an outer circumferential part of the semiconductor wafer.

13. The polishing device according to claim 11, wherein the warp suppressing unit rotates accompanied with a rotation of the semiconductor wafer mounted on the stage.

14. The polishing device according to claim 13, wherein the warp suppressing unit includes a first plate that is in contact with the outer circumferential part of the front surface of the semiconductor wafer, a second plate that is in contact with an outer circumferential part of the rear surface of the semiconductor wafer, and a second shaft that rotatably supports the first plate and the second plate, and wherein an outer circumferential part of the semiconductor wafer is interposed between the first plate and the second plate.

15. The polishing device according to claim 14, wherein the first plate and the second plate rotate around the second shaft by friction with the semiconductor wafer.

16. The polishing device according to claim 14, wherein the second shaft is arranged substantially parallel to the first shaft.

17. The polishing device according to claim 10, wherein the polishing unit is movable in a radial direction of the semiconductor wafer.

18. The polishing device according to claim 10, wherein the polishing unit includes a plurality of polishing devices arranged dispersedly at the rear surface side of the semiconductor wafer.

* * * * *